(12) United States Patent
Yamada et al.

(10) Patent No.: US 11,588,423 B2
(45) Date of Patent: Feb. 21, 2023

(54) ELECTRIC-POWER CONVERSION APPARATUS

(71) Applicant: Mitsubishi Electric Corporation, Tokyo (JP)

(72) Inventors: Tomonori Yamada, Tokyo (JP); Satoshi Ishibashi, Tokyo (JP); Naoya Abe, Tokyo (JP); Satoshi Wachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 211 days.

(21) Appl. No.: 17/073,556

(22) Filed: Oct. 19, 2020

(65) Prior Publication Data

US 2021/0194395 A1    Jun. 24, 2021

(30) Foreign Application Priority Data

Dec. 18, 2019    (JP) ............................ JP2019-227966

(51) Int. Cl.
| | |
|---|---|
| *H02P 5/74* | (2006.01) |
| *H05K 7/20* | (2006.01) |
| *H02M 1/14* | (2006.01) |
| *B60K 6/26* | (2007.10) |

(Continued)

(52) U.S. Cl.
CPC ................. *H02P 5/74* (2013.01); *B60K 6/26* (2013.01); *B60K 6/28* (2013.01); *B60L 53/20* (2019.02); *H02M 1/14* (2013.01); *H05K 7/209* (2013.01); *H05K 7/20854* (2013.01); *B60Y 2200/92* (2013.01); *B60Y 2400/112* (2013.01); *B60Y 2400/20* (2013.01); *B60Y 2400/60* (2013.01)

(58) Field of Classification Search
CPC ... B02P 5/74; B60L 53/20; B60K 6/26; B60K 6/28; H02M 1/14; H05K 7/20854; B60Y 2200/92; B60Y 2400/112; B60Y 2400/20; B60Y 2400/60
USPC ......................................................... 361/704
See application file for complete search history.

(56) References Cited

U.S. PATENT DOCUMENTS

| | | |
|---|---|---|
| 6,166,498 A | 12/2000 | Yamaguchi et al. |
| 2016/0218602 A1 | 7/2016 | Fukushima et al. |
| 2019/0020242 A1 | 1/2019 | Tomokage et al. |

(Continued)

FOREIGN PATENT DOCUMENTS

| | | | | |
|---|---|---|---|---|
| CN | 111907318 A | * | 11/2020 | ............... B60K 1/02 |
| JP | 2006-025556 A | | 1/2006 | |

(Continued)

*Primary Examiner* — Mahmoud Gimie
(74) *Attorney, Agent, or Firm* — Sughrue Mion, PLLC; Richard C. Turner (57) ABSTRACT

An electric-power conversion apparatus has a heat sink in which one side portion out of a pair of side portions that extend in a direction perpendicular to the axial direction of a motor is formed shorter than the other side portion thereof; a lower case to which the heat sink is fixed is fastened to a driving apparatus through the intermediary of fixing portions at the both end portions of each of the pair of side portions of the heat sink or at respective positions in the vicinity of the both end portions of each of the pair of side portions of the heat sink; at least one of a reactor and capacitors is disproportionately disposed to be closer to said one side portion than to said the other side portion of the heat sink.

6 Claims, 10 Drawing Sheets

(51) Int. Cl.
    *B60K 6/28*         (2007.10)
    *B60L 53/20*      (2019.01)

(56) References Cited

U.S. PATENT DOCUMENTS

2019/0312492 A1   10/2019   Fukushima et al.
2020/0358383 A1*  11/2020   Wakabayashi .......... B60L 50/16

FOREIGN PATENT DOCUMENTS

| JP | 2008199850 | A | * | 8/2008 | |
|----|------------|---|---|--------|---|
| JP | 4160987 | B2 | | 10/2008 | |
| JP | 5103369 | B2 | | 12/2012 | |
| JP | 2014073811 | A | * | 4/2014 | |
| JP | 20160087360 | A | * | 7/2016 | |
| JP | 2016-140198 | A | | 8/2016 | |
| JP | 2017-100611 | A | | 6/2017 | |
| JP | 2019-018660 | A | | 2/2019 | |
| JP | 6584736 | B1 | * | 10/2019 | ............ B60L 53/302 |
| WO | WO-2009028520 | A1 | * | 3/2009 | ............... B60K 6/28 |

\* cited by examiner

ELECTRIC-POWER CONVERSION APPARATUS

BACKGROUND OF THE INVENTION

Field of the Invention

The present disclosure relates to an electric-power conversion apparatus.

Description of the Related Art

As is well known, an electric vehicle in which a motor is utilized as the driving source therefor or a hybrid vehicle in which a motor or an engine is utilized, as the driving source therefor, in a switchable manner is provided with an electric-power conversion apparatus that performs electric-power conversion between the motor and a high-voltage battery mounted in the vehicle. The electric-power conversion apparatus is contained, as a unit, for example, in a case; in addition to circuit components included in an electric-power conversion circuit, the electric-power conversion apparatus is provided with constituent components such as a heat sink for cooling the electric-power conversion circuit and an MCU (Motor Control Unit) for controlling the motor by controlling switching operation performed by the electric-power conversion circuit. The motor, as the driving apparatus, and the unitized electric-power conversion apparatus are integrally coupled with each other.

A conventional vehicle driving apparatus disclosed in Patent Document 1 has a generator in addition to a motor and an electric-power conversion apparatus; the unit case of the electric-power conversion apparatus is bolted and fixed on the top portion of a housing for the motor and the generator. The housing for the motor and the generator is mounted on a housing for power generation apparatuses including an engine, a transmission, and the like; each of the rotation axles of the motor and the generator is coupled with the rotation axle of the engine.

A conventional vehicle driving apparatus disclosed in Patent Document 2, a fixing portion formed in an lower case of a circuit unit is fastened to the housing of the driving apparatus; the height of the fastening surface positioned at the upper end of the fixing portion is made to be situated within a height range from the lower surface to the upper surface of a heat sink for the circuit unit.

PRIOR ART REFERENCE

Patent Literature

[Patent Document 1] Japanese Patent Application Laid-Open No. 2016-140198

[Patent Document 2] Japanese Patent Application Laid-Open No. 2019-018660

SUMMARY OF THE INVENTION

In the conventional driving apparatus disclosed in Patent Document 1, vibration of the engine is transferred to the vehicle driving apparatus; the motor itself and the generator itself included in the vehicle driving apparatus also vibrate at a time of operation; due to these vibrations, the whole vehicle driving apparatus vibrates. Accordingly, because the vehicle driving apparatus and the electric-power conversion apparatus largely vibrate, there exists a probability that an adverse effect is provided to the constituent components in the electric-power conversion apparatus.

In contrast, it is argued that in the conventional driving apparatus disclosed in Patent Document 2, even when due to vibrations of the engine and the motor, the driving apparatus is vibrated, vibration of the circuit unit, as the electric-power conversion apparatus, can be suppressed from amplifying the vibration of the driving apparatus. However, the arrangement of the constituent components of the circuit unit, as the electric-power conversion apparatus, has not been considered; thus, there exists a probability that depending on the arrangement of the constituent components, the vibration of the driving apparatus cannot sufficiently be suppressed and hence a large vibration of the electric-power conversion apparatus provides an adverse effect to the inner constituent components thereof.

The present disclosure has been implemented in order to solve the foregoing problems; the objective thereof is to provide an electric-power conversion apparatus that does not provide any adverse effect to inner constituent components thereof.

In an electric-power conversion apparatus disclosed in the present disclosure, a case of the electric-power conversion apparatus to be fastened to a case of a driving apparatus of a vehicle having a motor contains at least one of an inverter to be electrically-connected with the motor and a converter to be electrically connected with a high-voltage battery mounted in the vehicle, and a heat sink for cooling at least one of the inverter and the converter is provided. The electric-power conversion apparatus is characterized in that the inverter is provided with a power module therefor including two or more switching devices and with a smoothing capacitor, in that the converter is provided with a power module including two or more switching devices, a reactor for smoothing a fluctuation in an electric current, and a smoothing capacitor, in that the case of the electric-power conversion apparatus is fastened to the case of the driving apparatus through the intermediary of fixing portions, and one side portion out of a pair of side portions is formed shorter than the other side portion thereof, and in that at least one of the reactor and the smoothing capacitor is disproportionately disposed to be closer to said one side portion than to said the other side portion.

The present disclosure makes it possible to obtain an electric-power conversion apparatus that does not provide any adverse effect to inner constituent components thereof.

The foregoing and other object, features, aspects, and advantages of the present invention will become more apparent from the following detailed description of the present invention when taken in conjunction with the accompanying drawings.

DETAILED DESCRIPTION OF THE PREFERRED EMBODIMENTS

Embodiment 1

Figure 1:
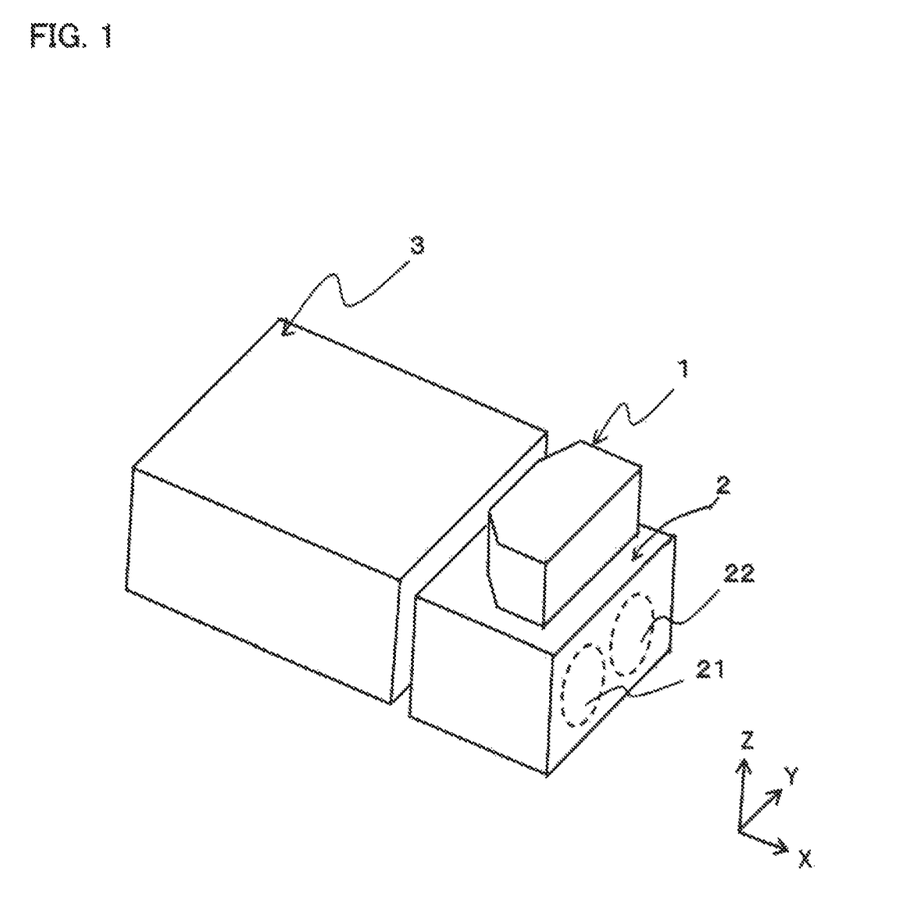
FIG. 1 is a perspective view schematically illustrating a state where an electric-power conversion apparatus according to Embodiment 1 is mounted on a vehicle driving apparatus.

FIG. 1 is a perspective view schematically illustrating a state where an electric-power conversion apparatus according to Embodiment 1 is mounted on a vehicle driving apparatus. In FIG. 1, an electric-power conversion apparatus 1 has an inverter and a converter, as after-mentioned electric-power conversion circuits. The electric-power conversion apparatus 1 is mounted on the top portion of a driving apparatus 2 of a hybrid vehicle. The driving apparatus 2 has a motor 21, as a vehicle driving source, and a generator 22 that performs power generation. The motor 21 and the generator 22 are contained in a common case. Each of the rotation axles of the motor 21 and the generator 22 is coupled with the rotation axle of the engine 3.

The case of the engine 3 and the case of the driving apparatus 2 are integrally fixed with each other; the after-mentioned case of the electric-power conversion apparatus 1 is mounted on the top portion of the case of the driving apparatus 2 and is fixed to the case of the driving apparatus 2 by a fastening means such as a bolt.

Here, the expressions indicating positional relationships or directions such as "top portion", "upper direction", "lower direction", "vertical direction", and "horizontal direction" signify the relative positional relationships or directions between the electric-power conversion apparatus 1 and the driving apparatus 2. The "vertical direction" in the relative relationship will be referred to as "Z-axis direction"; the axial direction of the motor 21 will be referred to as "X-axis direction", the direction perpendicular to the axial direction of the motor 21 will be referred to as "Y-axis direction".

Figure 2:
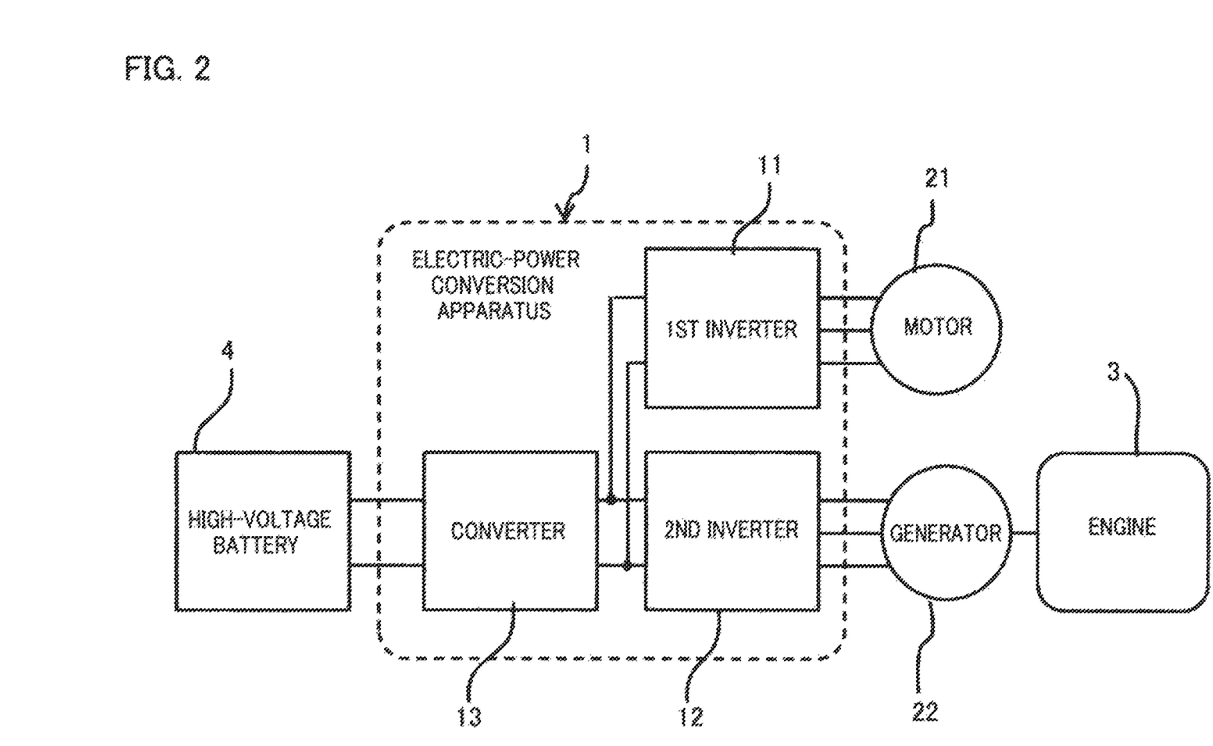
FIG. 2 is a block diagram representing an electrical configuration of the electric-power conversion apparatus according to Embodiment 1.

FIG. 2 is a block diagram representing an electrical configuration of the electric-power conversion apparatus according to Embodiment 1; an electric-power conversion apparatus to be mounted in a hybrid vehicle is represented. In FIG. 2, the electric-power conversion apparatus 1 has a first, inverter 11 for controlling the motor 21 as a vehicle driving source, a second inverter 12 for controlling the generator 22 that is driven by the engine 3 so as to generate electric power, and a converter 13 that increases or decreases the voltage of a secondary battery as a high-voltage battery 4 mounted in the vehicle.

The electric-power conversion apparatus 1 according to Embodiment 1 is mounted in a 2-motor-type hybrid vehicle provided with the motor 21 whose capacity is, for example, 50 [KW] to 200 [KW], the generator 22 whose capacity is, for example, 50 [KW] to 150 [KW], and the secondary battery as the high-voltage battery 4 whose output voltage is, for example, 100 [V] to 400 [V]. As is well known, in the 2-motor-type hybrid vehicle, the generator 22 generates electric power at the same time when the motor 21 drives the vehicle; electric power generated by the generator 22 that is driven by the engine 3 drives the motor 21, so that the vehicle is made to travel.

The electric-power conversion apparatus 1 can be utilized also in an electric vehicle such as a plug-in-type hybrid vehicle. Moreover, with regard to the foregoing driving apparatus 2 on which the electric-power conversion apparatus 1 is mounted, the type in which the driving apparatus 2 is integrally coupled with the engine 3 has been explained; however, the electric-power conversion apparatus 1 may be mounted on a driving apparatus separated from the engine or may be mounted on a driving apparatus of an electric automobile having no engine. Furthermore, it is not necessarily required that the driving apparatus 2 on which the electric-power conversion apparatus 1 is mounted is provided with both the motor 21 and the generator 22; it may be allowed that in the driving apparatus, the motor function and the generator function of a single electric rotating machine are separately utilized. The electric-power conversion apparatus 1 can be utilized not only in a vehicle such as an automobile but also in an electric vehicle such as a plug-in-type hybrid vehicle.

Figure 3:
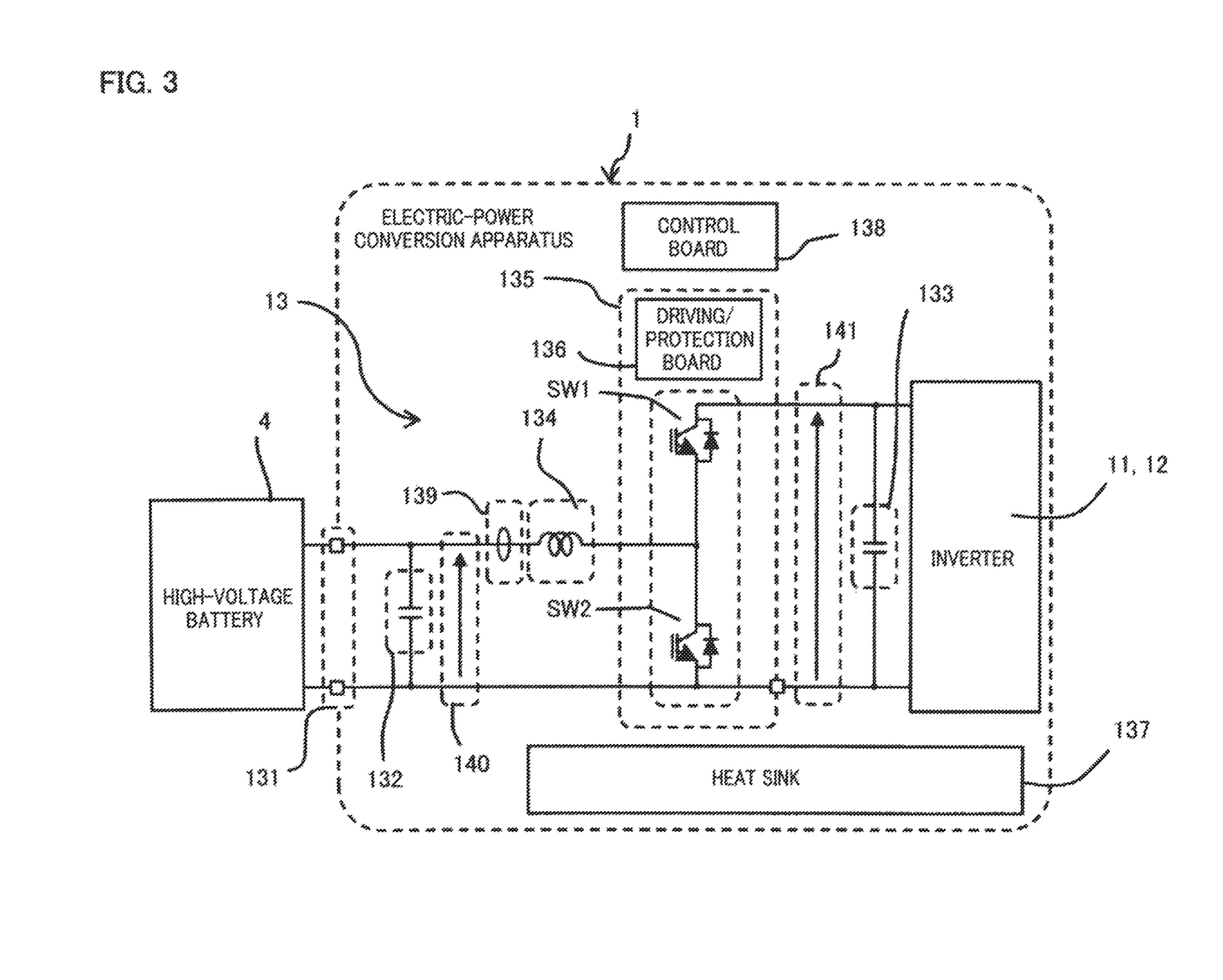
FIG. 3 is a circuit diagram of a converter in the electric-power conversion apparatus according to Embodiment 1.

FIG. 3 is a circuit diagram of the converter in the electric-power conversion apparatus according to Embodiment 1. In FIG. 3, the converter 13 has a connector 131 to be connected with the high-voltage battery 4, a primary smoothing capacitor 132 connected with DC input terminals to be connected with the connector 131, a secondary smoothing capacitor 133 connected with the first inverter 11 and the second inverter 12, a reactor 134 to be utilized for increasing the output voltage of the high-voltage battery 4, and an IPM (Intelligent Power Module) 135. The IPM 135 is a module provided with a pair of semiconductor switching devices SW1 and SW2 and a driving/protection board 136 having a circuit for driving and protecting the semiconductor switching devices SW1 and SW2.

The converter 13 further includes a heat sink 137 for cooling the IPM 135 and the reactor 134, a control board 138 for controlling switching timings for the semiconductor switching devices SW1 and SW2 in the IPM 135, a reactor current sensor 139 for detecting a current in the reactor 134, a primary voltage sensor 140 for detecting a voltage of the primary smoothing capacitor 132, and a secondary voltage sensor 141 for detecting a voltage of the secondary smoothing capacitor 133. The heat sink 137 is commonly utilized for cooling respective after-mentioned TPMs of the first inverter 11 and the second inverter 12.

As is well known, the converter 13 configured in such a manner as described above controls the semiconductor switching devices SW1 and SW2 by use of a drive signal from the driving/protection board 136, based on a control signal from the control board 138, so as to increase the DC output voltage of the high-voltage battery 4, and then inputs the increased DC output voltage to the respective DC terminals of the first inverter 11 and the second inverter 12; alternatively, the converter 13 decreases the respective voltages at the DC terminals of the first inverter 11 and the second inverter 12 and then inputs the decreased voltage to the high-voltage battery 4.

Figure 4:
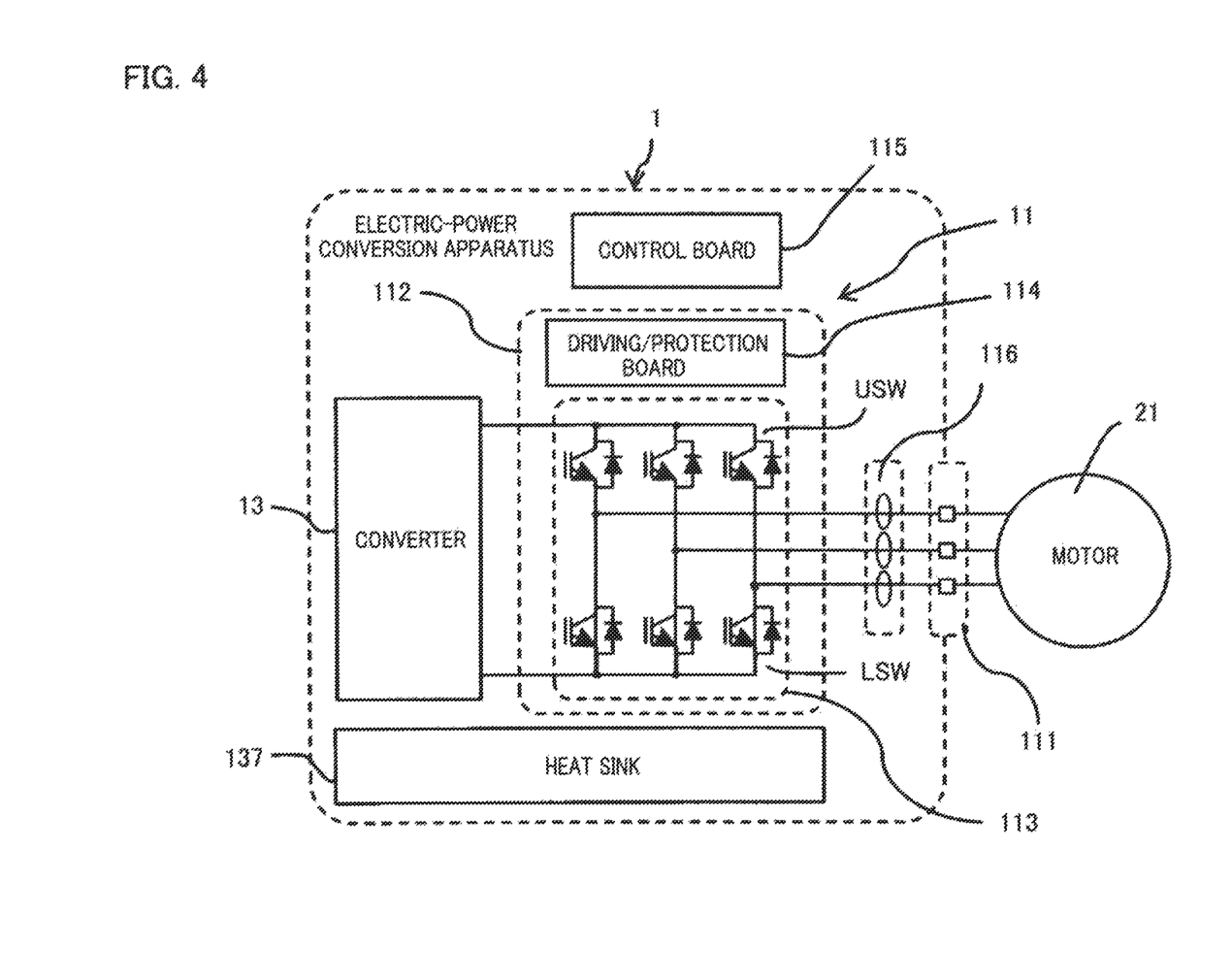
FIG. 4 is a circuit diagram of an inverter in the electric-power conversion apparatus according to Embodiment 1.

FIG. 4 is a circuit diagram of the inverter in the electric-power conversion apparatus according to Embodiment 1. In FIG. 4, the first inverter 11 is represented; however, the second inverter 12 has a configuration substantially the same as that of the first inverter 11 in FIG. 4. In FIG. 4, the first inverter 11 in the electric-power conversion apparatus 1 has a connector 111 and an IPM 112 to be connected with the motor 21. The IPM 112 is a module provided with a power module 113 in which a three-phase bridge circuit is formed of three upper-arm semiconductor switching devices USW and three lower-arm semiconductor switching devices LSW and with a driving/protection board 114 having a circuit for driving and protecting the upper-arm semiconductor switching devices USW and the lower-arm semiconductor switching devices LSW.

The first inverter 11 further includes the heat sink 137 for cooling the IPM 112, a control board 115 for controlling respective switching timings for the upper-arm semiconductor switching devices USW and the lower-arm semiconductor switching devices LSW in the IPM 112, and a current sensor 116 for detecting a three-phase output current of the three-phase bridge circuit. The DC terminals of the power module 113 are connected with the DC terminals of the foregoing converter 13; the three-phase AC terminals of the power module 113 are connected with the three-phase AC terminals of the motor 21 by way of the connector 111. The heat sink 137 is commonly utilized as the respective heat sinks for the inverter 11, the foregoing converter 13, and the after-mentioned inverter 12. It may be allowed that the respective heat sinks dedicated to the first inverter 11 and the second inverter 12 are provided.

The first inverter 11 configured in such a manner as described above controls respective switching operations of the upper-arm semiconductor switching devices USW and the lower-arm semiconductor switching devices LSW by use of a drive signal from the driving/protection board 114, based on a control signal from the control board 115, so as to convert DC electric power inputted from the converter 13 into AC electric power, and then supplies the AC-electric power to the motor 21 so as to drive the motor 21.

The second inverter 12 has a configuration substantially the same as that of the first inverter 11; however, the connector corresponding to the connector 111 of the first inverter 11 is connected with the generator 22. The second inverter 12 converts three-phase AC electric power generated by the generator 22 into DC electric power and then supplies the DC electric power to the motor 21 by way of the first inverter 11 or to the high-voltage battery 4 by way of the converter 13.

The heat sink 137 is made of high-heat-conductivity metal such as aluminum, has a thickness in the height direction thereof, and has cooling fins and refrigerant flow paths (water jacket) between the top surface and the bottom surface. An inlet pipe (unillustrated), which makes a refrigerant flow into an inner flow path, and an outlet pipe, which makes the refrigerant flow out of the inner flow path, are connected with the heat, sink 137. The heat sink 137 forms part, of a cooling circuit through which the heat sink 137 makes the refrigerant circulate, along with an unillustrated tank, pump, radiator, and the like. Parts of the foregoing constituent-components in the inverter and the converter, which are to be cooled, are fixed to the top surface or the bottom surface of the heat sink 137.

Figure 5:
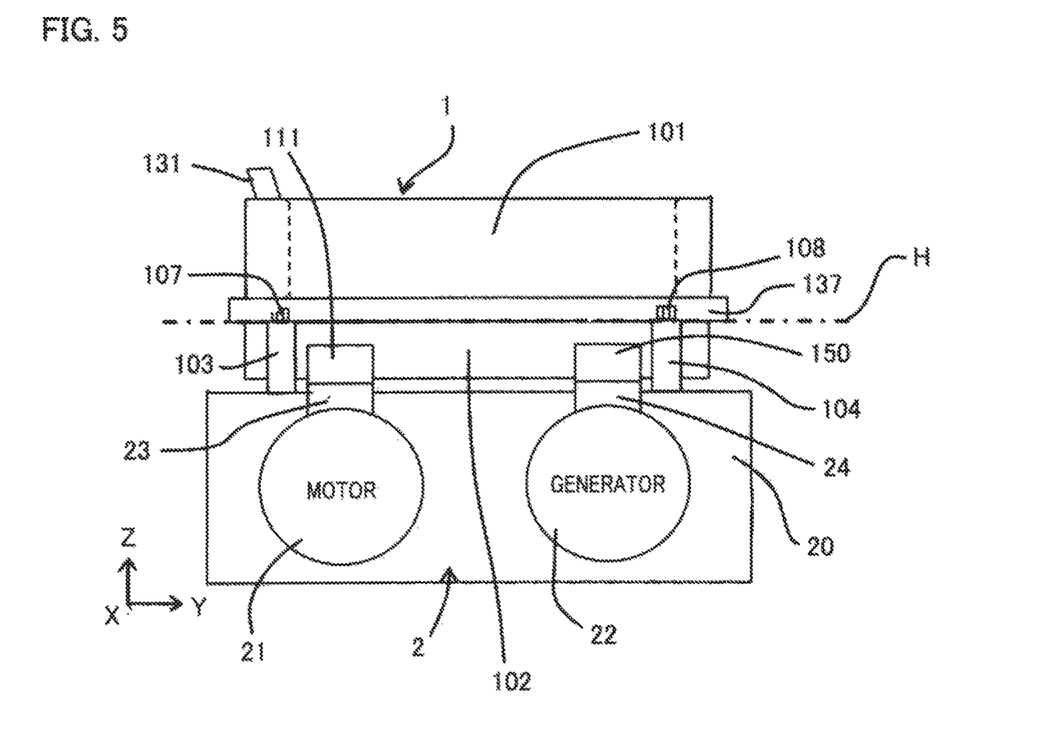
FIG. 5 is a side view illustrating the electric-power conversion apparatus according to Embodiment 1, mounted on the vehicle driving apparatus.

Next, a case where the electric-power conversion apparatus 1 is fixed to the driving apparatus 2 will be explained. FIG. 5 is a side view illustrating the electric-power conversion apparatus according to Embodiment 1, mounted on the vehicle driving apparatus. In FIG. 5, the electric-power conversion apparatus 1 has an upper case 101 and a lower case 102, as the case of an electric-power conversion apparatus; the foregoing converter 13, the first inverter 11, and the second inverter 12 are contained in the case of the electric-power conversion apparatus. In the vicinity of the motor 21, the first inverter 11 is disposed inside the case of the electric-power conversion apparatus; in the vicinity of the generator 22, the second inverter 12 is disposed inside the case of the electric-power conversion apparatus 1; in the vicinity of the high-voltage battery 4, the converter 13 is disposed inside the case of the electric-power conversion apparatus. The heat sink 137 is pinched by the upper case 101 and the lower case 102 and is integrally fixed to each of the upper case 101 and the lower case 102

In the lower case 102 of the electric-power conversion apparatus 1, respective fixing portions 103, 104, 105, and 106 are provided at the both end portions of each of two side portions that extend in the Y-axis direction and face each other or at four positions, i.e., respective two positions in the vicinity of the both end portions of each of the two side portions. In FIG. 5, only the fixing portions 103 and 104 among the fixing portions at the four positions are illustrated. The fixing portions 103, 104, 105, and 106 at the four positions abut on the top portion of the case 20 of the driving apparatus 2, so that the electric-power conversion apparatus 1 is mounted on the driving apparatus 2; the electric-power conversion apparatus 1 is robustly fixed to the case 20 of the driving apparatus 2 by means of four bolts 107, 108, 109, and 110. In FIG. 5, only the two bolts 107 and 108 among the four bolts are illustrated.

The bolt 107 penetrates the fixing portion 103 from the top portion of the fixing portion 103 and is screwed to the case 20 of the driving apparatus 2; the bolt 108 penetrates the fixing portion 104 from the top portion of the fixing portion 104 and is screwed to the case 20 of the driving apparatus 2. The other bolts (two bolts) that are not illustrated are configured in the same manner. A fastening surface H between the lower case 102 of the electric-power conversion apparatus 1 and the case 20 of the driving apparatus 2 coincides with the bottom surface of the heat sink 137.

Figure 6:
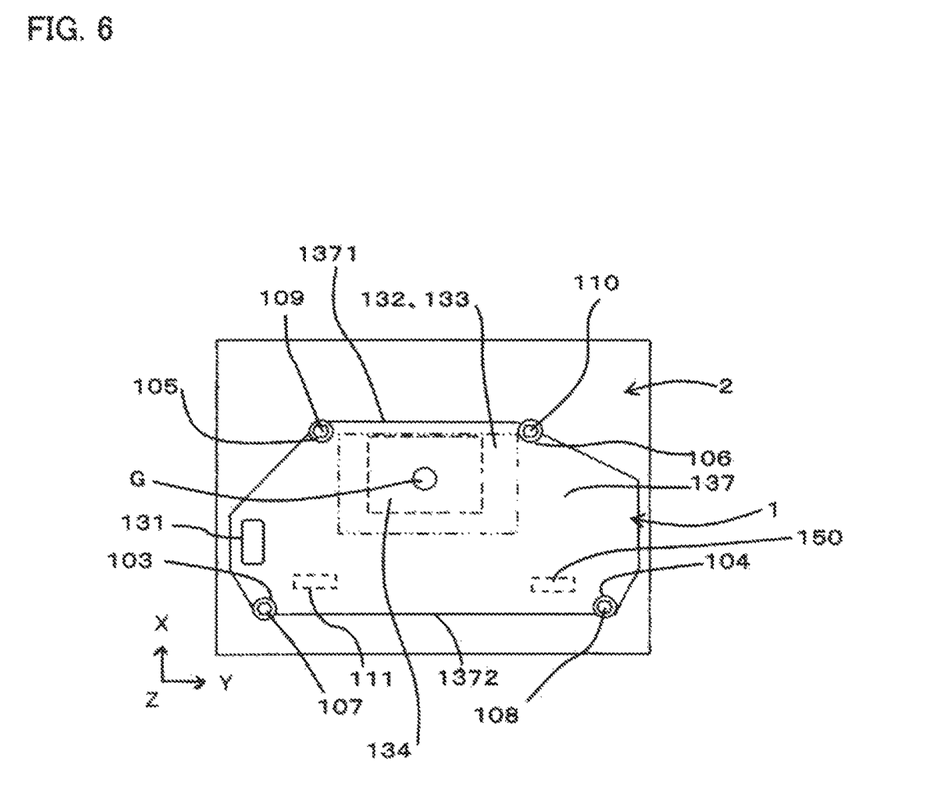
FIG. 6 is a schematic plan view illustrating arrangement of constituent components in the electric-power conversion apparatus according to Embodiment 1.
Figure 7:
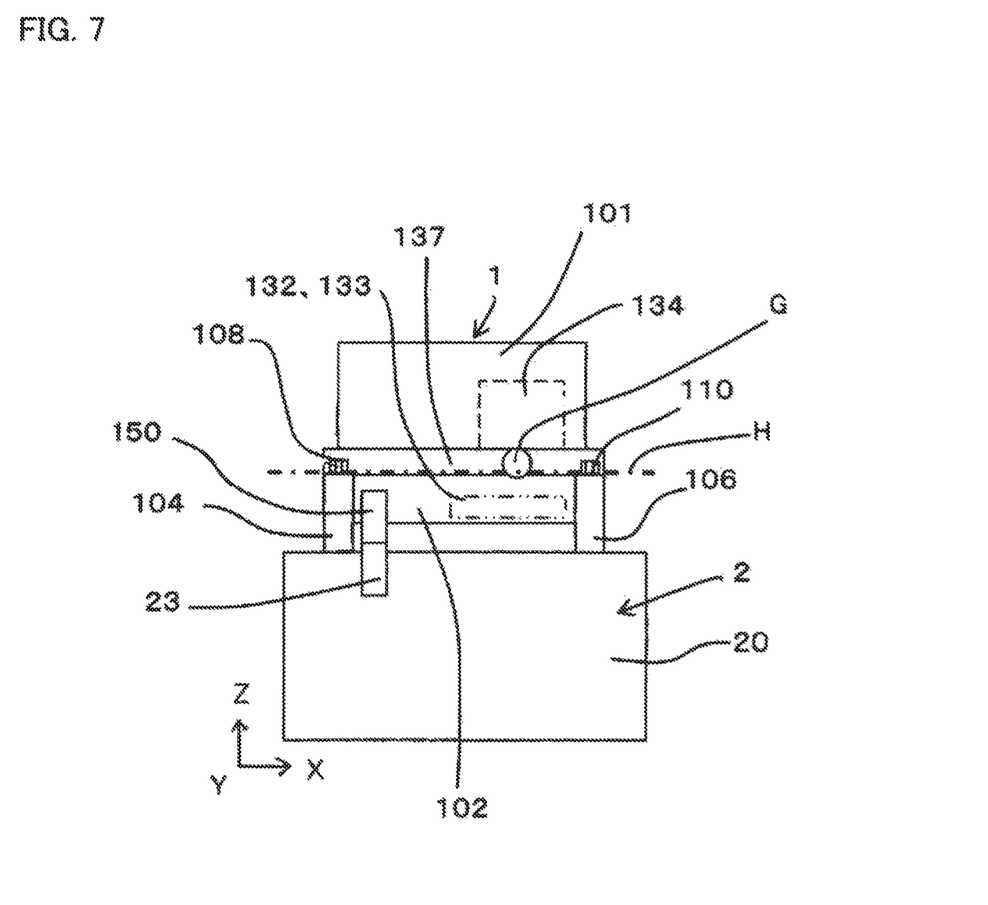
FIG. 7 is a schematic side view illustrating arrangement of the constituent components in the electric-power conversion apparatus according to Embodiment 1.

The connector 111 and a connector 150, of the electric-power conversion apparatus 1, that correspond to the motor 21 and the generator 22, respectively, are provided in the bottom, portion of the lower case 102 of the electric-power conversion apparatus 1 and are coupled and electrically connected with a connector 23 of the motor 21 and a connector 24 of the generator 22, respectively, provided in the case 20 of the driving apparatus 2. A connector separated into the part in the electric-power conversion apparatus 1 and the part in the driving apparatus 2 has been illustrated; however, there may be adopted a connection structure in which a terminal platform is provided in one of the electric-power conversion apparatus 1 and the driving apparatus 2 and the terminal platform is connected with the other one thereof by means of a bus bar, FIG. 6 is a schematic plan view illustrating arrangement of constituent components in the electric-power conversion apparatus according to Embodiment 1; FIG. 7 is a schematic side view illustrating arrangement of the constituent components in the electric-power conversion apparatus according to Embodiment 1. In the case of the electric-power conversion apparatus 1 that is fastened to the case 20 of the driving apparatus 2, the number of connection lines required for electrically connecting the motor 21 with the electric-power conversion apparatus 1 is 3, when the motor 21 is a three-phase motor; in the case where the driving apparatus 2 includes the motor 21 and the generator 22, the number of connection lines required is [3×2], i.e., 6. In the case where the electric connection component for electrically fastening the connection lines together is a terminal platform, the terminal platforms are disproportionately arranged in any one of the sides of the case of the electric-power conversion apparatus 1, at which the work of fastening from outside is readily performed.

Even in the case where the connectors 111 and 150, which do not require any work of fastening from, the outside, are utilized, the case where the connectors 111 and 150 are arranged to be close to the outside, disproportionately in any one of the front, rear, left, and right sides is more frequent than the case where the connectors 111 and 150 are arranged in the central portion of the electric-power conversion apparatus 1, in order to secure the accommodation space for the inner constituent components. Because it is required to avoid the positions of the connectors 111 and 150 or the terminal platforms, the pitches of fastening the case 20 of the driving apparatus 2 to the electric-power conversion apparatus 1 become imbalanced in terms of the length.

For the foregoing reason, as illustrated in FIGS. 6 and 1, the planar shape of the heat sink 137 of the electric-power conversion apparatus 1 is the shape of not a rectangle but a trapezoid in which the length of one side portion 1371 thereof in the Y-axis direction is shorter than the length of the other side portion 1372 thereof.

In Embodiment 1, the reactor 134, the primary smoothing capacitor 132, and the secondary smoothing capacitor 133, which are heavy-weight components among the constituent components of the electric-power conversion apparatus 1, are disproportionately arranged at the side of the shorter side portion 1371 out of the side portions 1371 and 1372, of the heat sink 137, that face each other and are parallel to each other. In other words, the heavy-weight constituent components of the electric-power conversion apparatus 1 are disproportionately arranged at the side where the pitch between the fixing portions for fastening the lower case 102 of the electric-power conversion apparatus 1 to the case 20 of the driving apparatus 2 is shorter. In addition, in Embodiment 1, the reactor 134 is disposed on the surface of the top portion of the heat sink 137; in the lower case 102, the smoothing capacitors 132 and 133 are arranged at the positions that are beneath and apart from the heat sink 137.

As illustrated in FIG. 6, the positon of the gravity center G, in the XY plane, of the electric-power conversion apparatus 1 is disproportionately situated at the side portion 1371 where the pitch between the fixing portions for fastening the electric-power conversion apparatus 1 to the case of the driving apparatus 2 is shorter. As a result, even when vibrations of the engine 3, the motor 21, and the generator 22 cause vibrations of the respective cases of the driving apparatus 2 and the electric-power conversion apparatus 1, the vibration at the gravity center G is diminished; thus, the vibration of the electric-power conversion apparatus 1 can be suppressed from amplifying the vibration of the driving apparatus 2. The gravity center G of the electric-power conversion apparatus 1 is situated at a substantially central position in the Y-axis direction.

As illustrated in FIG. 7, the position of the gravity center G, in the Z-axis direction, of the electric-power conversion apparatus 1 is situated in the vicinity of the fastening surface H between the electric-power conversion apparatus 1 and the driving apparatus 2. As a result, even when vibrations of the engine 3, the motor 21, and the generator 22 cause a vibration of the driving apparatus 2, the vibration of the electric-power conversion apparatus 1 can further be suppressed from amplifying the vibration of the driving apparatus 2.

Embodiment 2

Figure 8:
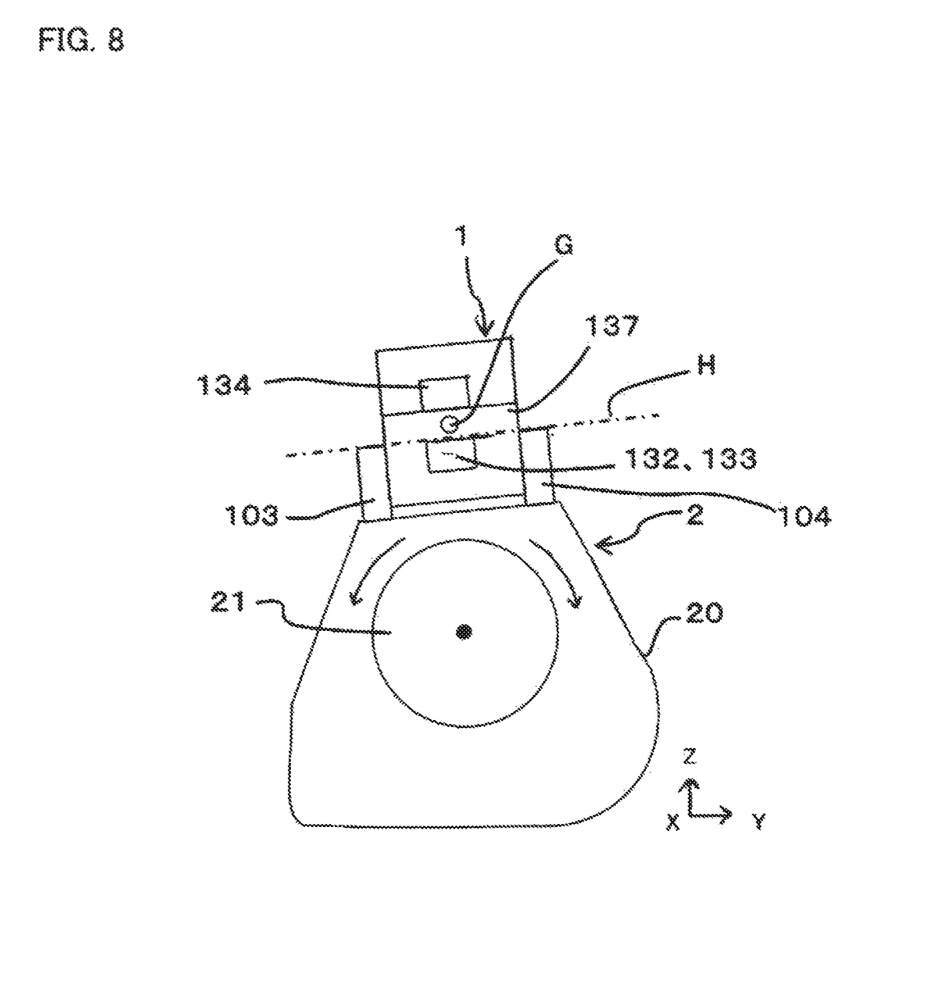
FIG. 8 is an explanatory view for explaining an electric-power conversion apparatus according to Embodiment 2, mounted on a vehicle driving apparatus.

Next, an electric-power conversion apparatus according to Embodiment 2 will be explained. FIG. 8 is an explanatory view for explaining an electric-power conversion apparatus according to Embodiment 2, mounted on a vehicle driving apparatus. In the case where the distance between the gravity center G and the fastening surface H is large, a vibration, in the arrow direction, of the case 20 of the driving apparatus 2 causes a large moment in the Y-axis direction to be exerted at a position having a height the same as that of the gravity center G. In Embodiment 2, as illustrated in FIG. 8, the fastening surface H between the electric-power conversion apparatus 1 and the driving apparatus 2 is at a height that is within the height range of the heat sink 137 and is the same as the height of the bottom, surface of the heat sink 137; the reactor 134, which is one of the constituent components of the converter 13, consists of iron and copper, and has a relatively large weight, is dispose on the top surface of the heat sink 137; the smoothing capacitors 132 and 133, each of which consists of aluminum, and copper and has a relatively large weight, are arranged on the bottom surface of the heat sink 137. As a result, the position of the gravity center G of the electric-power conversion apparatus 1 is at a height immediately close to the height of the fastening surface H.

As described above, the position of the gravity center G of the electric-power conversion apparatus 1 is at a height immediately close to the height of the fastening surface H; thus, even when the respective cases of the driving apparatus 2 and the electric-power conversion apparatus 1 vibrate in the arrow direction, the moment, in the Y-axis direction, at the position having a height the same as that of the gravity center G is decreased, so that the vibration of the electric-power conversion apparatus 1 can further be suppressed from amplifying the vibration of the driving apparatus 2.

As is the case with Embodiment 1, the positon of the gravity center G, in the XY plane, of the electric-power conversion apparatus 1 is disproportionately situated at the side portion 1371 where the pitch between the fixing portions for fastening the electric-power conversion apparatus 1 to the case of the driving apparatus 2 is shorter. The gravity center G of the electric-power conversion apparatus 1 is situated at a substantially central position in the Y-axis direction.

Embodiment 3

Figure 9:
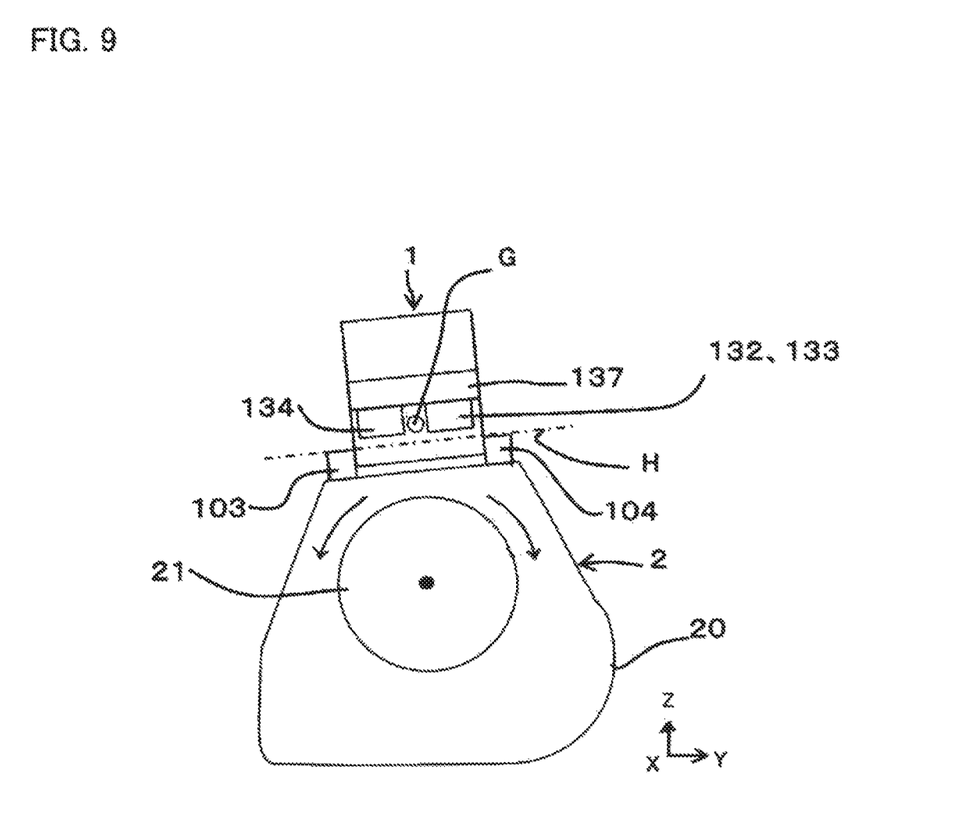
FIG. 9 is an explanatory view for explaining an electric-power conversion apparatus according to Embodiment 3, mounted on a vehicle driving apparatus.

Next, an electric-power conversion apparatus according to Embodiment 3 will be explained. FIG. 9 is an explanatory view for explaining an electric-power conversion apparatus according to Embodiment 3, mounted on a vehicle driving apparatus. As illustrated in FIG. 9, the fastening surface H where the electric-power conversion apparatus 1 and the driving apparatus 2 are fastened to each other is at a position lower than the position of the heat sink 137. In this case, the position of the gravity center G of the electric-power conversion apparatus 1 is higher than the fastening surface H. In the case where the distance between the gravity center G and the fastening surface H is large in the upward direction, vibrations, in the arrow direction, of the respective cases of the driving apparatus 2 and the electric-power conversion apparatus 1 cause a large moment in the Y-axis direction to be exerted at a position having a height the same as that of the gravity center G.

Accordingly, in Embodiment 3, the reactor 134 and the smoothing capacitors 132 and 133, which are relatively heavy components of the electric-power conversion apparatus 1, are arranged in the region ranging from the bottom surface of the heat sink 137 to the fastening surface H. As a result, the height position of the gravity center G of the electric-power conversion apparatus 1 is close to that of the fastening surface H. It may be allowed that at least one of the reactor and the smoothing capacitor is disposed in the region ranging from the top surface of the heat sink 137 to the fastening surface H.

Accordingly, even when the respective cases of the case 20 of the driving apparatus 2 and the electric-power conversion apparatus 1 vibrate in the arrow direction, the moment in the Y-axis direction at a position having a height the same as that of the gravity center G is small; thus, the vibration of the electric-power conversion apparatus 1 can further be suppressed from, amplifying the vibration of the driving apparatus 2.

As is the case with Embodiment 1, the positon of the gravity center G, in the XY plane, of the electric-power conversion apparatus 1 is disproportionately situated at the side portion 1371 where the pitch between the fixing portions for fastening the electric-power conversion apparatus 1 to the case of the driving apparatus 2 is shorter. The gravity center G of the electric-power conversion apparatus 1 is situated at a substantially central position in the Y-axis direction.

Embodiment 4

Figure 10:
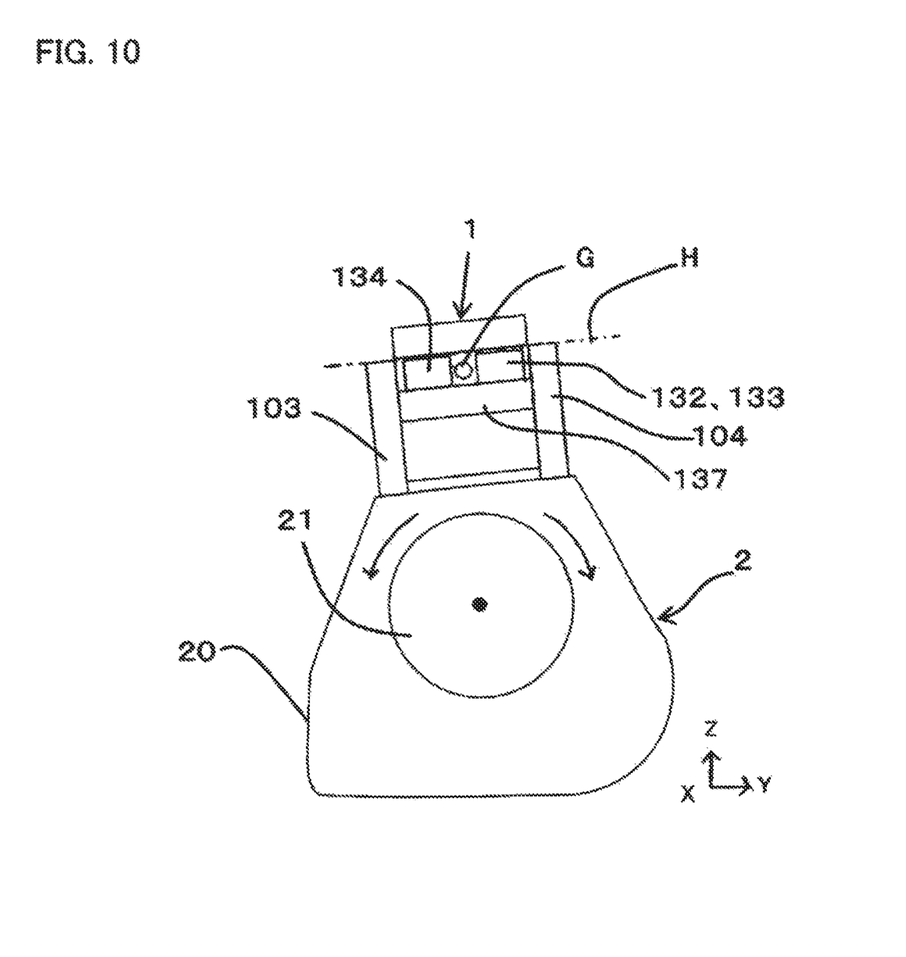
FIG. 10 is an explanatory view for explaining an electric-power conversion apparatus according to Embodiment 4, mounted on a vehicle driving apparatus.

Next, an electric-power conversion apparatus according to Embodiment 4 will be explained. FIG. 10 is an explanatory view for explaining an electric-power conversion apparatus according to Embodiment 4, mounted on a vehicle driving apparatus. As illustrated in FIG. 10, the fastening surface H where the electric-power conversion apparatus 1 and the driving apparatus 2 are fastened to each other is at a position higher than the top surface of the heat-sink 137. That is to say, the fastening surface situated on the top end of the fixing portion exists at a position that is apart from the top surface of the heat sink in the direction leaving the case of the driving apparatus. In this case, the position of the gravity center G of the electric-power conversion apparatus 1 is lower than the fastening surface H. In the case where the distance between the gravity center G and the fastening surface His large in the downward direction, vibrations, in the arrow direction, of the respective cases of the driving apparatus 2 and the electric-power conversion apparatus 1 cause a large moment in the Y-axis direction to be exerted at a position having a height the same as that of the gravity center G.

Accordingly, in Embodiment 4, the reactor 134 and the smoothing capacitors 132 and 133, which are relatively heavy constituent components of the electric-power conversion apparatus 1, are arranged in the region ranging from the top surface of the heat sink 137 to the fastening surface H. As a result, the height position of the gravity center G of the electric-power conversion apparatus 1 is close to that of the fastening surface H. It may be allowed that at least-one of the reactor and the smoothing capacitor is disposed in the region ranging from the top surface of the heat sink 137 to the fastening surface H.

Accordingly, even when the respective cases of the case 20 of the driving apparatus 2 and the electric-power conversion apparatus 1 vibrate in the arrow direction, the moment in the Y-axis direction at a position having a height the same as that of the gravity center G is small; thus, the vibration of the electric-power conversion apparatus 1 can further be suppressed from amplifying the vibration of the driving apparatus 2.

As is the case with Embodiment 1, the positon of the gravity center G, in the XY plane, of the electric-power conversion apparatus 1 is disproportionately situated at the side portion 1371 where the pitch between the fixing portions for fastening the electric-power conversion apparatus 1 to the case of the driving apparatus 2 is shorter. The gravity center G of the electric-power conversion apparatus 1 is situated at a substantially central position in the Y-axis direction.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present application. For example, there are included the case where at least one constituent element is modified, added, or omitted and the case where at least one constituent element is extracted and then combined with constituent elements of other embodiments.

What is claimed is:

1. An electric-power conversion apparatus,
wherein a case of the electric-power conversion apparatus to be fastened to a case of a driving apparatus of a vehicle having a motor contains at least one of an inverter to be electrically connected with the motor and a converter to be electrically connected with a high-voltage battery mounted in the vehicle, and a heat sink for cooling at least one of the inverter and the converter is provided,
wherein the inverter is provided with a power module therefor including two or more switching devices and with a smoothing capacitor,
wherein the converter is provided with a power module including two or more switching devices, a reactor for smoothing a fluctuation in an electric current, and a smoothing capacitor,
wherein the case of the electric-power conversion apparatus is fastened to the case of the driving apparatus through the intermediary of fixing portions, and one side portion out of a pair of side portions is formed shorter than the other side portion thereof,
wherein at least one of the reactor and the smoothing capacitor is disproportionately disposed to be closer to said one side portion than to said the other side portion,
wherein the heat sink forms part of a cooling circuit for circulating a refrigerant, and has an inner flow path for circulating the refrigerant, and
wherein at least a portion of the heat sink is exposed to the exterior of the case of the electric-power conversion apparatus.

2. The electric-power conversion apparatus according to claim 1, wherein at a side close to the motor, parts of constituent components of the inverter are arranged inside the case of the electric-power conversion apparatus; and wherein at a side away from the motor or at a side close to a connection portion between the high-voltage battery and the converter, parts of constituent components of the converter are arranged inside the case of the electric-power conversion apparatus.

3. The electric-power conversion apparatus according to claim 1, wherein the case of the electric-power conversion apparatus includes a lower case to be fastened to the case of the driving apparatus through the intermediary of the fixing portions and an upper case to be fixed to the lower case through the intermediary of the heat sink, wherein a fastening surface situated on the top end of the fixing portion exists at a position corresponding to the bottom surface of the heat sink, and wherein at least one of the reactor and the smoothing capacitor is disposed at the top surface side of the heat sink.

4. The electric-power conversion apparatus according to claim 1, wherein the case of the electric-power conversion apparatus includes a lower case to be fastened to the case of the driving apparatus through the intermediary of the fixing portions and an upper case to be fixed to the lower case through the intermediary of the heat sink, wherein a fastening surface situated on the top end of the fixing portion exists at a position corresponding to the bottom surface of the heat sink, wherein the reactor is disposed on the top surface of the heat sink, and wherein the smoothing capacitor is disposed on the bottom surface of the heat sink.

5. The electric-power conversion apparatus according to claim 1, wherein a fastening surface situated on the top end of the fixing portion exists at a position that is apart from the bottom surface of the heat sink toward the case of the driving apparatus, and wherein at least one of the reactor and the smoothing capacitor is disposed at the bottom surface side of the heat sink.

6. The electric-power conversion apparatus according to claim 1, wherein the case of the electric-power conversion apparatus includes a lower case to be fastened to the case of the driving apparatus through the intermediary of the fixing portions and an upper case to be fixed to the lower case through the intermediary of the heat sink, wherein a fastening surface situated on the top end of the fixing portion exists at a position that is apart from the top surface of the heat sink in a direction leaving the case of the driving apparatus, and wherein at least one of the reactor and the smoothing capacitor is disposed at the top surface side of the heat sink.

* * * * *